(12) United States Patent
Matsuoka et al.

(10) Patent No.: US 7,780,391 B2
(45) Date of Patent: Aug. 24, 2010

(54) SUBSTRATE PROCESSING DEVICE

(75) Inventors: Takaaki Matsuoka, Tokyo (JP);
Katsuhiko Iwabuchi, Kanagawa (JP);
Shigeru Ishizawa, Yamanashi (JP);
Tsutomu Hiroki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 803 days.

(21) Appl. No.: 10/513,813

(22) PCT Filed: May 9, 2003

(86) PCT No.: PCT/JP03/05830

§ 371 (c)(1),
(2), (4) Date: Apr. 21, 2005

(87) PCT Pub. No.: WO03/096410

PCT Pub. Date: Nov. 20, 2003

(65) Prior Publication Data

US 2005/0238464 A1    Oct. 27, 2005

(30) Foreign Application Priority Data

May 10, 2002  (JP) .............................. 2002-136102

(51) Int. Cl.
*H01L 21/677* (2006.01)
(52) U.S. Cl. .................. 414/217; 414/222.08; 414/411; 414/416.04; 414/939
(58) Field of Classification Search ................ 414/217, 414/411, 939, 416.04, 222.08
See application file for complete search history.

(56) References Cited

U.S. PATENT DOCUMENTS

| | | | | |
|---|---|---|---|---|
| 4,532,970 A | * | 8/1985 | Tullis et al. | 414/217.1 |
| 4,540,326 A | * | 9/1985 | Southworth et al. | 414/217 |
| 4,682,927 A | * | 7/1987 | Southworth et al. | 414/217 |
| 5,372,471 A | * | 12/1994 | Wu | 414/806 |
| 5,377,476 A | * | 1/1995 | Bohmer et al. | 53/255 |
| 5,382,127 A | * | 1/1995 | Garric et al. | 414/217.1 |
| 5,382,128 A | * | 1/1995 | Takahashi et al. | 414/404 |
| 5,388,945 A | * | 2/1995 | Garric et al. | 414/217.1 |
| 5,390,785 A | * | 2/1995 | Garric et al. | 206/213.1 |

(Continued)

FOREIGN PATENT DOCUMENTS

JP           6-97258           4/1994

(Continued)

OTHER PUBLICATIONS

Rail definition printed Dec. 12, 2009 from merriam-webster.com.*

*Primary Examiner*—Michael Scott Lowe
(74) *Attorney, Agent, or Firm*—Crowell & Moring LLP

(57) ABSTRACT

Processing chambers (3A-3F) for applying a process to a substrate W housed therein are provided at a periphery of a conveying chamber 2. A conveying case (4) houses the substrate (W) in a state isolated from an outside atmosphere. The conveyance case (4) has a gate valve (30) and a transfer mechanism (22). A conveying mechanism (5) supports the conveyance case (4), and carries the conveyance case (4) to a position for conveying in/conveying out a substrate. The number of processing chambers connectable to a conveying chamber is not limited, and conveyance to the processing chamber can be executed while maintaining a predetermined ambience for an atmosphere of a substrate that is to be processed.

11 Claims, 7 Drawing Sheets

U.S. PATENT DOCUMENTS

| | | | |
|---|---|---|---|
| 5,399,531 A * | 3/1995 | Wu ............................ 700/112 |
| 5,411,358 A * | 5/1995 | Garric et al. ................ 414/277 |
| 5,509,772 A * | 4/1996 | Doche ........................ 414/217 |
| 5,772,386 A * | 6/1998 | Mages et al. ................ 414/411 |
| 6,285,102 B1 * | 9/2001 | Matsuoka et al. ............. 310/90 |
| 6,431,806 B1 * | 8/2002 | Doche ........................ 414/217 |
| 6,439,822 B1 * | 8/2002 | Kimura et al. ......... 414/331.04 |
| 6,481,558 B1 * | 11/2002 | Bonora et al. ............ 198/346.2 |
| 6,517,304 B1 * | 2/2003 | Matsumoto ................ 414/217 |
| 6,935,828 B2 * | 8/2005 | Ackeret et al. ............. 414/217 |
| 6,955,197 B2 * | 10/2005 | Elliott et al. .................. 141/98 |
| 7,234,584 B2 * | 6/2007 | Rice et al. ................ 198/465.1 |
| 7,258,520 B2 * | 8/2007 | Elliott et al. ................ 414/217 |
| 7,299,831 B2 * | 11/2007 | Elliott et al. .................. 141/98 |
| 2005/0232734 A1 * | 10/2005 | Elliott et al. ................. 414/411 |
| 2007/0000612 A1 * | 1/2007 | Nozawa et al. ......... 156/345.32 |
| 2007/0116545 A1 * | 5/2007 | Rice et al. ................... 414/411 |
| 2007/0140822 A1 * | 6/2007 | Elliott et al. ............. 414/684.3 |

FOREIGN PATENT DOCUMENTS

| | | |
|---|---|---|
| JP | 7-312335 | 11/1995 |
| JP | 9-330972 | 12/1997 |
| JP | 10-56051 | 2/1998 |
| JP | 11-345859 | 12/1999 |
| JP | 2000-294613 | 10/2000 |

* cited by examiner

SUBSTRATE PROCESSING DEVICE

TECHNICAL FIELD

The present invention relates to a substrate processing apparatus, and more particularly to a substrate processing apparatus having a conveying mechanism for conveying a substrate such as a semiconductor wafer to a processing chamber for processing the substrate under a predetermined atmosphere.

BACKGROUND ART

A step of supplying a process gas in a predetermined decompressed atmosphere is often employed in processing a substrate such as a semiconductor wafer This process is often performed by disposing the substrate in a processing chamber capable of maintaining a decompressed atmosphere. In general, many steps are included in processing a substrate. Plural processing chambers for performing the steps are connected to a substrate conveying chamber, in which a substrate is conveyed into a processing with a conveying mechanism such as a robot provided in the conveying chamber, and is conveyed out from the processing chamber to another processing chamber.

This substrate processing apparatus is generally referred to as a cluster tool. In general, plural processing chambers and load-lock chambers are disposed at a periphery of a conveying chamber, and a robot in the conveying chamber performs conveyance of a substrate via an arm. The load-lock chamber is a pressure-adjusting chamber for conveying a substrate into a conveying chamber from the outside, and conveying a substrate out from the conveying chamber to the outside. That is, since the conveying chamber is connected to the processing chamber, the inside of the conveying chamber is required to maintain a decompressed atmosphere similar to the atmosphere in the processing chamber. Therefore, the load-lock chamber is provided to isolate the ambience in the conveying chamber from the outside.

With the above-described cluster tool, there is a limit in the number of processing chambers which can be arranged, since the processing chambers and the load-lock chamber are required to be arranged in a manner surrounding the conveying chamber. For example, in a case of a conveying chamber having a pentagon shape when viewed from above, the number of chambers that can be connected to the conveying chamber is limited to one load-lock chamber and four processing chambers, where each processing chamber is connected to one side of the pentagon. Although the number of sides connectable to a processing chamber can be increased by employing a polygon having same or more sides than a pentagon as the shape of the conveying chamber, one of the sides becomes smaller than the size of the processing chamber. As a result, the processing chamber cannot be connected. Accordingly, the number of processing chambers that can be arranged is limited for a conventional cluster tool, and thus, there is a problem of being unable to handle processes such as a process of consecutively performing numerous steps or a process of simultaneously performing a single or numerous steps in parallel.

In order to solve this problem, an increase in the number of processing chambers by connecting two cluster tools, for example, is proposed. However, even with this configuration, the number of connectable processing chambers is limited. In addition, a mechanism for conveying a substrate from one cluster tool to another is required, which thereby complicates and enlarges the configuration of the apparatus.

Furthermore, since the space of the conveying chamber becomes larger as the number of processing chambers increases, a pump having large throughput is required for maintaining a decompressed atmosphere in such a large space, thereby raising a problem of increasing cost.

DISCLOSURE OF INVENTION

It is a general object of the present invention to provide an improved and useful substrate processing apparatus in which the above-mentioned problems are eliminated.

A more specific object of the present invention is to provide a substrate processing apparatus that has no restrictions in the number of processing chambers connectable to a conveying chamber, and is able to convey a substrate to a processing chamber while maintaining a predetermined ambience with respect to an atmosphere of a substrate that is to be processed.

In order to achieve the above-mentioned objects, there is provided according to one aspect of the present invention, a substrate processing apparatus including, at least one processing chamber for applying a process to a substrate housed therein, a conveyance case for carrying a substrate in a state isolated from an outside atmosphere, having an entry port for conveying in/conveying out a substrate, and a conveying mechanism for carrying the conveyance case to a first position for conveying in/conveying out a substrate to the processing chamber.

Furthermore, according to another aspect of the present invention, there is provided a substrate processing apparatus including, a plurality of processing chambers for applying a process to a substrate housed therein, having a conveyance port for conveying in/conveying out a substrate, a conveyance case for housing a substrate in a state isolated from an outside atmosphere, having an entry port for conveying in/conveying out a substrate, a conveying mechanism for carrying the conveyance case to a first position for conveying in/conveying out a substrate to the processing chamber, and a conveying chamber delimiting a space in which the conveying mechanism travels, and having a periphery connected to the processing chambers, wherein the entry port of the conveyance case is connected to the conveyance port of the processing chamber at the first position.

With the present invention, the conveyance case can be conveyed to the processing chamber while maintaining a predetermined state with respect to an ambience of the substrate housed inside the conveyance case, and the substrate maintaining the predetermined state can be conveyed into the processing chamber. Accordingly, the conveying chamber, which delimits a space including the conveying mechanism, is not required to maintain a predetermined atmosphere, such as high vacuum. Further, the conveying chamber can be enlarged, and the number of connectable processing chambers can be increased to a given number.

In the above-described invention, the conveyance case may preferably be supported detachably by the conveying mechanism. The conveyance case can be made small and lightweight by providing a conveyance case that houses a few substrates, and plural conveyance cases can be conveyed with a common conveying mechanism by making the conveyance case separable from the conveying mechanism.

Furthermore, the conveyance case may have a transfer mechanism for conveying in/conveying out a substrate through the entry port. Furthermore, the conveying chamber may have a substrate conveyance port for conveying in/conveying out a substrate, wherein the conveyance case may be transported between a second position at which the entry port is connected to the substrate conveyance port and the first position by the conveying mechanism.

Furthermore, the conveyance case may have an airtight structure for maintaining therein a predetermined degree of vacuum, and may be provided with an evacuation port at the substrate conveyance port of the conveying chamber. Furthermore, an evacuation port may be provided at the conveyance port of the processing chamber. Furthermore, the conveyance case may be configured to house two substrates, wherein the transfer mechanism may be separately provided with respect to each substrate. Furthermore, a transfer mechanism drive source for driving the transfer mechanism may be provided at a fixed position separate from the conveyance case, wherein the transfer mechanism drive source may be connected to the transfer mechanism when the conveyance case is fixed to the first or second position. Furthermore, the conveyance case may have a closing mechanism for closing the entry port, wherein a closing mechanism drive source for driving the closing mechanism may be provided at a fixed position separate from the conveyance case, wherein the closing mechanism drive source may be connected to the closing mechanism when the conveyance case is fixed to the first or second position.

Other objects, features and advantages of the present invention will become more apparent from the following detailed description when read in conjunction with the accompanying drawings.

BEST MODE FOR CARRYING OUT THE INVENTION

Figure 1:
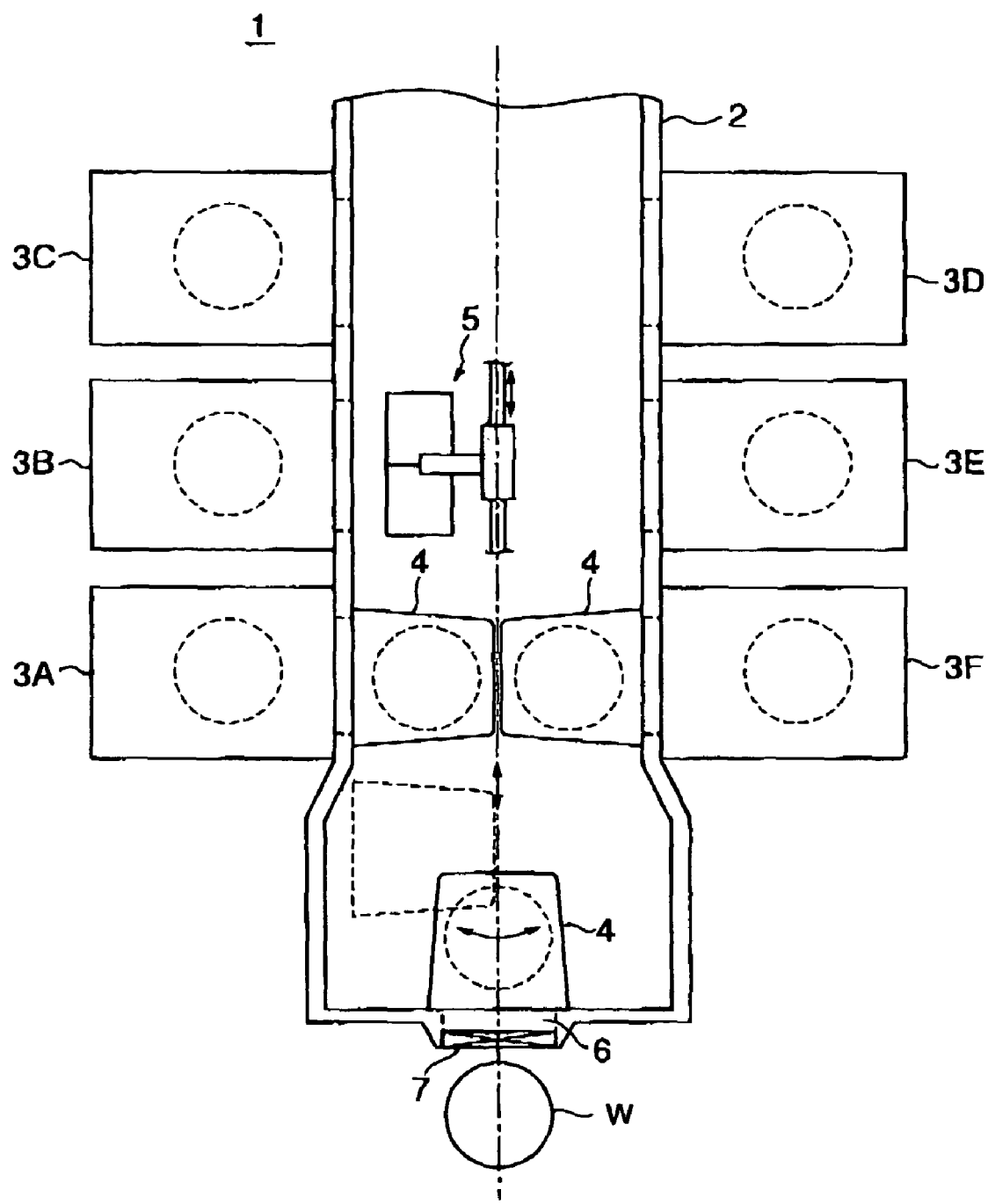
FIG. 1 is a schematic plan view showing an entire structure of a substrate processing apparatus according to one embodiment of the present invention.

Next, an embodiment of the present invention is described with reference to the drawings FIG. 1 is a schematic plan view showing an entire structure of a substrate processing apparatus according to one embodiment of the present invention. A substrate processing apparatus shown in FIG. 1 includes a conveying chamber 2, processing chambers 3A-3F arranged at the periphery of the conveying chamber 2, conveyance cases 4 that are conveyed inside the conveying chamber 2, and a case conveying mechanism 5 for conveying the conveyance cases 4 in the conveying chamber 2.

In this embodiment, the conveying chamber 2 is formed as a longitudinally long chamber, and is connected to the processing chambers 3A-3F that are aligned in a longitudinal direction on both sides thereof. A substrate conveyance port 6 for conveying a semiconductor wafer (substrate) W into and out from the conveying chamber 2 is provided at an end part of the conveying chamber 2 in the longitudinal direction. A gate valve 7 for isolating the inside of the conveying chamber 2 from the outside is provided to the substrate conveyance port 6.

The conveying chamber 2 is formed, for example, as a longitudinally long chamber having an airtight structure, and having both sides connected to the processing chambers 3A-3F along the longitudinal direction. It is to be noted that, although this embodiment illustrates a configuration having six processing chambers 3A-3F, more processing chambers may be connected to the conveying chamber 2 by extending the conveying chamber 2 in the longitudinal direction. The inside of the conveying chamber 2 may be maintained in a vacuum state by an exhaust part (not shown), or under atmospheric pressure.

Figure 2:
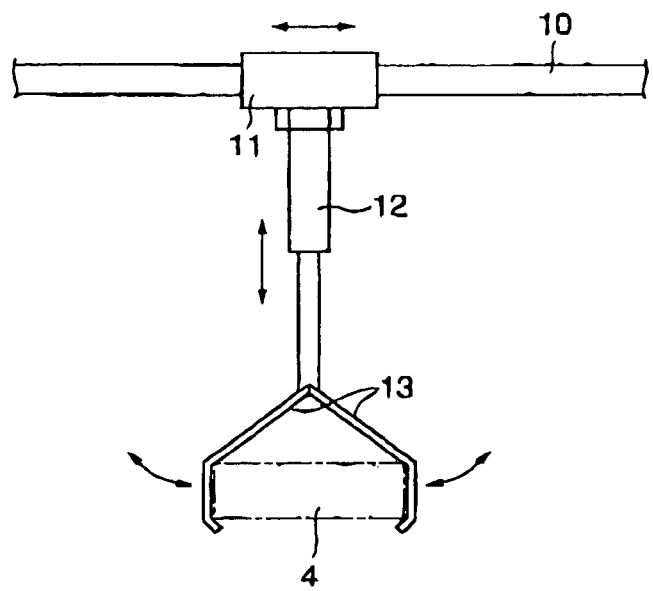
FIG. 2 is a side view of a conveying mechanism provided in a conveying chamber shown in FIG. 1.

The conveying mechanism 5 as shown in FIG. 2 is provided in the conveying chamber 2. The conveying mechanism 5 is a transporting part for conveying the conveyance case 4 in the conveying chamber 2, and transports the conveyance case 4 between positions corresponding to a conveyance entrance/exit of the respective processing chambers 3A-3F (first position), and between a position corresponding to the substrate conveyance port 6 of the conveying chamber 2 (second position) and the first position. The conveyance case 4 transported between the first position and the second position can be separated from the conveying mechanism 5, and be independently left in a state connected to a wall of the conveying chamber 2. Nevertheless, the conveyance case 4 does not have to be separated from the conveying mechanism 5, but rather can be supported by the conveying mechanism 5 and maintain being connected to the conveying chamber 2.

The conveyance case 4 is of a size for housing a small number of semiconductor wafers W, such as one or two, and is conveyed in the conveying chamber 2 by the conveying mechanism 5 shown in FIG. 2. The conveyance case 4 is formed as a container which can isolate an inner space housing the semiconductor wafer W from the outside. More specifically, the conveyance case 4 has an airtight structure, and can maintain the inside at a predetermined degree of vacuum. Alternatively, a predetermined gas may be sealed in the inside. It is to be noted that plural conveying mechanisms 5 may be provided in the conveying chamber 2 to have the conveyance cases 4 conveyed by the plural conveying mechanisms 5.

With the substrate processing apparatus 1 having the foregoing configuration, the conveyance case 4 is transported to the second position, and the semiconductor wafer W from outside the conveying chamber 2 is housed in the conveyance case 4. After the semiconductor wafer W is conveyed into the conveyance case 4, the conveyance case 4 is sealed. Subsequently, the conveyance case 4 is transported to the position corresponding to a conveyance port of a processing chamber (for example, processing chamber 3A) in which the semiconductor wafer W is to be processed (first position). In this embodiment, the conveying mechanism 5 engages the conveyance case 4 only during transport. It is to be noted that the circles illustrated with the dotted lines in FIG. 1 indicate the positions of the semiconductor wafers W in the conveyance cases 4 and in the processing chambers 3A-3F.

The semiconductor wafer W is conveyed into a corresponding processing chamber 3A from the conveyance case 4 being transported to the first position Here, the conveyance case 4, having a transfer mechanism (described below) built-in, is able to transport the semiconductor wafer W inside the conveyance case 4 into the processing chamber 3A merely with an operation of the built-in transfer mechanism. Furthermore, the semiconductor wafer W processed in the processing apparatus 3A can be transported into the conveyance case 4 merely with an operation of the built-in transfer mechanism.

Accordingly, the inside of the conveyance case 4 can be provided with an atmosphere isolated from the outside, and also the semiconductor wafer w can be conveyed into and out from the conveyance case 4 merely with the built-in transfer mechanism.

FIG. 2 is a drawing showing an example of the conveying mechanism 5 for conveying the conveyance case 4 in the conveying chamber 2. The conveying mechanism 5 shown in FIG. 2 is configured as a crane capable of moving along a predetermined track in the conveying chamber 2. That is, a rail 10 extending in the longitudinal direction of the conveying chamber 2 is provided, and an arm part 12 is attached to a travel part 11 that travels along the rail 10. The rail 10 is disposed at an upper part in the conveying chamber 2, and the arm part 12 is provided extending in a perpendicularly downward direction. The arm part 12 is retractable and has a grip part 13 provided at a distal end thereof. The grip part 13 has a shape for enabling engagement and holding of the conveyance case. By extending and contracting of the arm part 12, the grip part 13 can be moved in a perpendicular direction.

The conveying mechanism 5 holds the conveyance case 4 with the grip part 13 and moves inside the conveying chamber 2. When a conveyance case 4 is transported to the first position or the second position, the conveyance case 4 is attached to the wall of the conveying chamber 2. Thereby, even when the engagement with the grip part 13 of the conveying mechanism 5 is released, that is, even when the conveyance case 4 is separated from the grip part 13, the conveyance case 4 is held at the first or second position.

Figure 3:
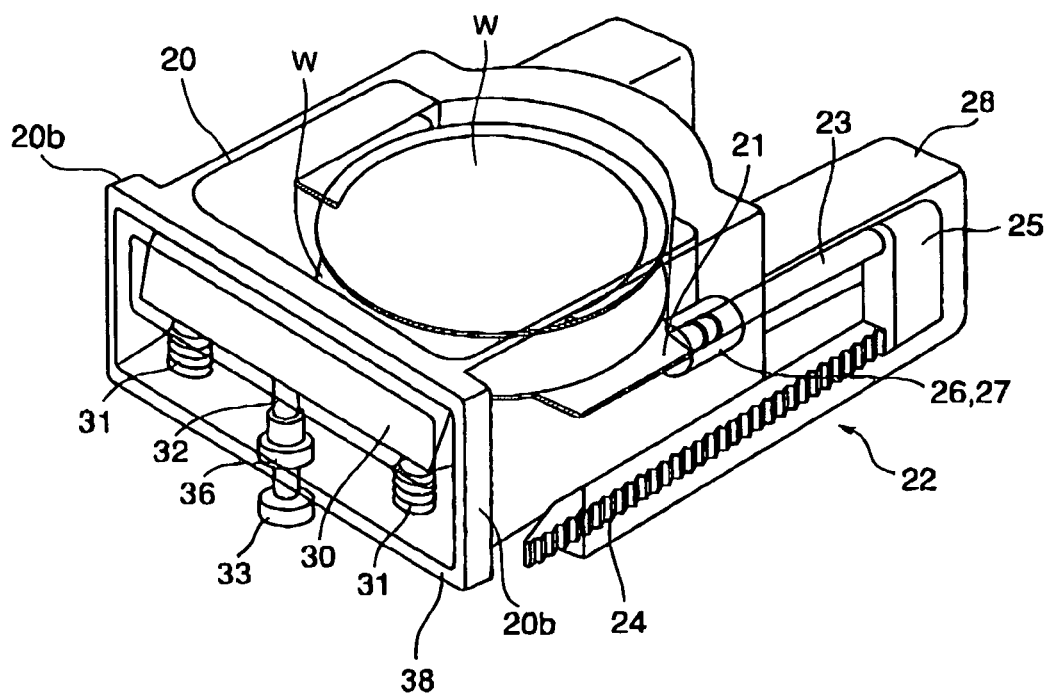
FIG. 3 is a transparent perspective view showing the inside of a conveyance case shown in FIG. 1.
Figure 4:
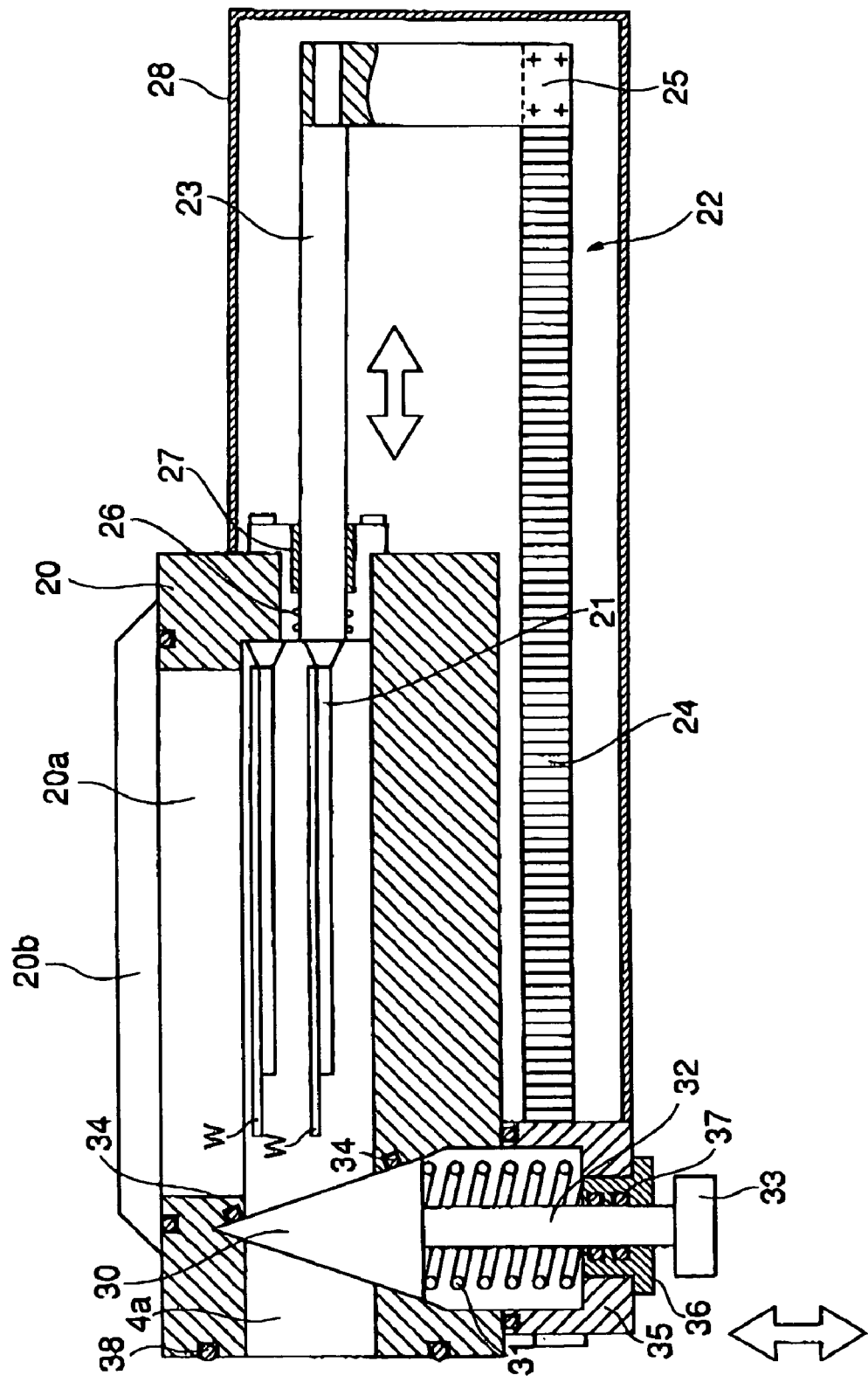
FIG. 4 is a cross-sectional view of a conveyance case shown in FIG. 1.

Next, an example of the conveyance case 4 is described with reference to FIGS. 3 and 4. FIG. 3 is a perspective view of the conveyance case 4 in which the inside is transparently illustrated. FIG. 4 is a cross-sectional view of the conveyance case 4.

As shown in FIGS. 3 and 4, the conveyance case 4 in this embodiment is able to house two semiconductor wafers W, and houses two semiconductor wafers W in a space in a case main body 20. The case main body 20 is formed of, for example, aluminum, and has rigidity that can endure external pressure when the inside is decompressed. An opening 20a is provided in a top plate part of the case main body 20. The opening 20a is, for example, covered by a top plate 20b formed of a transparent material, and allows the state of the housed semiconductor wafers W to be seen from the outside.

Each of the two semiconductor wafers W has its outer peripheral part mounted on a substantially circumferential pick 21. The pick 21 has the semiconductor wafers W disposed on two levels where one is situated above the other, and has corresponding transfer mechanisms 22 provided thereto. Either one of the top or bottom semiconductor wafers is a semiconductor wafer that has been processed and the other is a semiconductor wafer that is yet to be processed. That is, for example, in a case where the conveyance case 4 is conveyed to the processing chamber 3A, the conveyance case 4 is housed with one semiconductor wafer W that is yet to be processed, in which case a semiconductor wafer W processed in the processing chamber 3A is first housed into the conveyance case 4, and then the semiconductor wafer that is yet to be processed is conveyed into the processing chamber 3A. Accordingly, the pick 21 is configured to perform transfers independently with the respective transfer mechanisms 22.

The transfer mechanism 22 includes a rod 23 connected to the pick 21, and a rack 24 for moving the rod in a longitudinal direction of the conveyance case 4. The rod 23 and the rack 24 are coupled with a coupling part 25, and are movable as a united body. A distal end part of the rack 24 is exposed at a lower part of the case main body 20, and is engaged to a pinion provided to a conveyance case attachment mechanism which is described below. That is, by driving the rack 24 with the pinion, the rod 23 is moved, and the pick 21 being attached to the distal end of the rod 23 is moved between the inside and outside of the conveyance case 4. Therefore, the semiconductor wafer w mounted on one of the picks 21 can be transported outside of the conveyance case 4, that is, into the processing chamber, and the processed semiconductor wafer inside the processing chamber can be conveyed into the conveyance case 4 with the other one of the picks 21.

Since the rod 23 has one end entering the inside of the conveyance case 4, and another end connected to the coupling part 25 at the outside, it is extended in a manner penetrating the wall of the case main body 20. Therefore, in order to maintain the inside of the case main body 20 in a decompressed atmosphere, a vacuum seal 26, such as an O-ring, is provided between the rod 23 and the case main body 20. The vacuum seal 26 is disposed in the vicinity of a guide 27 for slidably holding the rod 23.

It is to be noted that since the rod 23 and the rack 24 move in a state projecting from a rear side of the conveyance case 4, they are covered by a cover 28. In the transfer mechanism 22 shown in FIGS. 3 and 4, when the rack 24 moves to a front direction of the conveyance case 4 in a state where the pick 21 is situated inside the conveyance case 4, the pick 21 passes through an entry port 4a and is moved outside of the conveyance case 4.

Next, a gate valve 30, which is a closing mechanism for closing the entry port 4a of the conveyance case 4, is described. The gate valve 30 is opened when conveying the semiconductor wafer W from the conveyance case 4 and conveying the semiconductor wafer into the conveyance case 4, and is closed in cases besides these cases. The inside of the conveyance case 4 can be isolated from the outside by closing the gate valve 30.

The gate valve 30 has a triangle-shaped cross-section, and is disposed in a lower side of the case main body 20 having an apex part of the triangle provided upward. A bottom part of the triangle is urged by a coil spring 31, and is held in a state where the apex part of the triangle is pressed toward an upper part of the case main body 20. The bottom part of the gate valve 30 is connected to a driving member 32, and an end part of the driving member 32 is extended from a lower part of the case main body to an outside direction.

A flange member 33 is provided to the end part of the driving member 32, and is engaged with an engagement member of a conveyance case attachment mechanism described below. Thereby, the flange member 33 can be moved in a perpendicularly downward direction. When the flange member 33 is moved downward, the gate valve 30 moves downward against the urging force of the coil spring 31, and the entry port 4a of the conveyance case 4 is opened.

A vacuum seal 34 is disposed at a portion where the gate valve 30 contacts the case main body 20 for maintaining a vacuum state in the conveyance case 4 when the gate valve 30 is closed. Furthermore, the driving member 32 is slidably attached to a spring housing part 35 attached to the case main body 20. Accordingly, a slide member 36 is provided to the spring housing part 35, and a vacuum seal 37 is provided to the slide member 36.

An end face of the entry port 4a of the case main body 20 abuts against a plate member of a conveyance case attachment mechanism. Here, a vacuum seal 38 is provided to the end face of the entry port 4a for airtight sealing of the entry port 4a.

Figure 5:
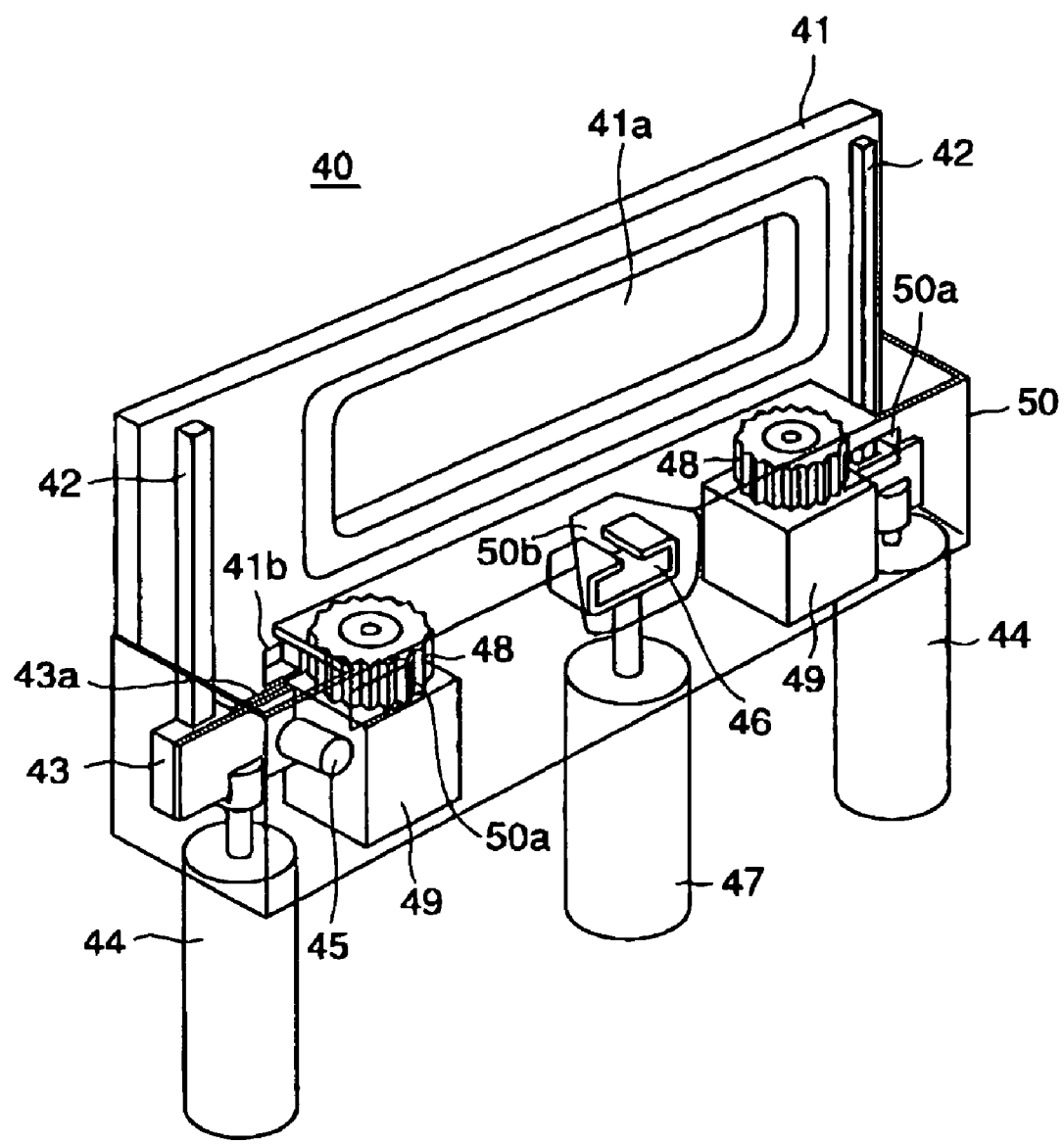
FIG. 5 is a transparent perspective view showing the inside of a conveyance case attachment mechanism.

Next, a conveyance case attachment mechanism 40 is described with reference to FIG. 5. FIG. 5 is a transparent perspective view of the conveyance case attachment mechanism 40, in which the inside is illustrated.

The conveyance case attachment mechanism 40 is disposed at portions corresponding to the conveyance ports of the processing chambers 3A-3F, and includes a function of fixing the conveyance case 4 to the above-described first position. Furthermore, the conveyance case attachment mechanism 40 is also disposed at an inner side of the substrate conveyance port 6 of the conveying chamber 2, and includes a function of fixing the conveyance case 4 to the above-described second position.

The conveyance case attachment mechanism 40 includes a plate member 41 and a function member attached thereto. The plate member 41 includes an opening 41a communicating with the conveyance port of the processing chamber. In the state where the conveyance case 4 is attached to the conveyance case attachment mechanism 40, the entry port 4a of the conveyance case 4 is aligned with the opening 41a. Accordingly, the entry port 4a of the conveyance case 4 communicates with the conveyance port of the processing chamber via the opening 41a to allow transfer of the semiconductor wafer W.

Rail members 42 are attached to both sides of the plate member 41, and case fixing members 43 are movably disposed along the rail members 42. The case fixing members 43 are moved by docking actuators 44 attached at a lower part.

The conveyance case 4 is conveyed by the above-described conveying mechanism 5, and is arranged in a manner where the entry port 4a is aligned to the opening 41a of the plate member 41. In this state, the flange parts 20b (see FIG. 3) disposed on both sides of the case main body 20 of the conveyance case 4 are situated at inner sides of the rail members 42. In this state, when the case fixing members 43 are moved upward along the rail members 42 by driving the docking actuators 44, a pressure part 43a of the case fixing member 43 moves above the flange part 20b of the conveyance case 4. Accordingly, the flange part 20b is situated between the plate member 41 and the pressure part 43a.

A pressure actuator 45 is attached to the pressure part 43a for pressing the flange part 20b against the plate member 41. Accordingly, an end plane provided to the entry port 4a of the conveyance case 4 is pressingly fixed against the plate member 41 from the pressure of the flange part 20b. In this state, since the vacuum seal 38 of the conveyance case is abutted and pressed against the plate member 41, air tightness can be maintained between the entry port 4a of the conveyance case 4 and the opening 41a of the plate member 41.

Here, in fixing the conveyance case 4 to the plate member 41, a flange member 33 extending from a lower side of the conveyance case 4 is engaged with an engagement member 46 of the conveyance case attachment mechanism 40. That is, the flange member 33 is inserted in a channel type engagement member 46. After the conveyance case 4 is fixed to the plate member 41, the flange member 33 is drawn downward by driving a gate actuator 47 and moving the engagement member 46 downward. Since the conveyance case 4 is fixed to the plate member 41, the gate valve 30 is lowered, and the entry port 4a of the conveyance case becomes open.

Furthermore, in fixing the conveyance case 4 to the plate member 41, the distal ends of the rack 24 exposed at a lower side of the conveyance case 4 are engaged by pinions 48 provided to the conveyance case attachment mechanism 40. The pinions 48 are driven by arm motors 49. That is, after the conveyance case 4 is fixed to the plate member 41, the rack 24 of the conveyance case 4 and the pick 21 in the conveyance case 4 can be moved by driving the arm motors 49.

Accordingly, with the conveyance case attachment mechanism 40 according to this embodiment, the flange member 33 can engage the engagement member 46 and enable actuation of the gate valve 30 by merely fixing the conveyance case 4 to the plate member 41, and thus the rack 24 can engage the pinions 48 and move the pick 21.

It is to be noted that although a function member attached to the plate member 41 is protected by being covered by a cover 50, the cover 50 is provided with an opening for extending the rack 24, and an opening 50b for inserting of the flange member 33. Furthermore, an opening 41b is provided to the plate member 41 for extending the rack 24.

Figure 6:
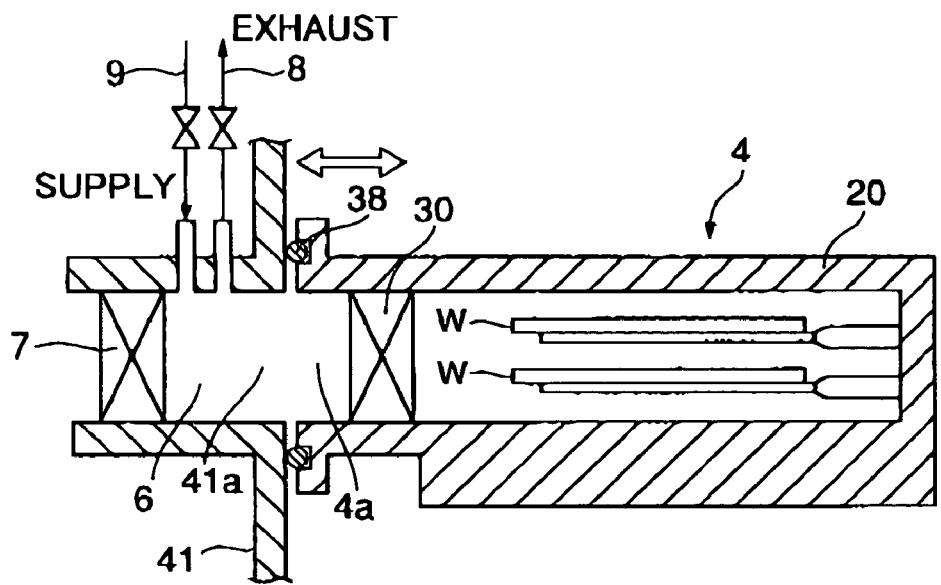
FIG. 6 is a drawing showing a state where a conveyance case is fixed to a position of a substrate conveyance port.

Next, a configuration of an attachment portion in a case of attaching the conveyance case 4 to the substrate conveyance port 6 of the conveying chamber 2 is described with reference to FIG. 6. FIG. 6 is a drawing of a configuration showing a state where the conveyance case 4 is fixed to a position corresponding to the substrate conveyance port 6 (second position). It is to be noted that the configuration shown in FIG. 6 is schematically illustrated.

The above-described plate member 41 of the conveyance case attachment mechanism 40 also serves as a wall of the conveying chamber 2, and the conveyance case 4 is air-tightly attached having the entry port 4a in a state aligned to the opening 41a of the plate member 41. The opening 41a continues to the substrate conveyance port 6 of the conveying chamber 2, and has the above-described gate valve 7 provided thereto. The gate valve 7 is opened only when conveying in and conveying out the semiconductor wafer. In the state where the conveyance case 4 is attached, a space is created between the gate valve 30 of the conveyance case 4 and the gate valve 7 of the conveying chamber 2.

Here, it is supposed that a vacuum state is maintained inside the conveyance case 4. In conveying the semiconductor wafer W into the conveyance case 4, the gate valve 7 of the conveying chamber 2 and the gate valve 30 of the conveyance case 4 are opened. Accordingly, since the inside of the conveyance case 4 reaches an atmospheric pressure state in a case where the outside of the conveying chamber 2 is at atmospheric pressure, the inside of the conveyance case 4 has to be evacuated.

Accordingly, in this embodiment, an evacuation line 8 and a gas supply line 9 are connected to the substrate conveyance port 6. After the semiconductor wafer W is conveyed into the conveyance case 4, the gate valve 7 of the conveying chamber 2 is first closed, and evacuation is performed by the evacuation line 8 in a state where the gate valve 30 of the conveyance case 4 is left open. Thereby, the space in the substrate conveyance port 6 and the inside of the conveyance case 4 is evacuated. By closing the gate valve 30 after the degree of vacuum reaches a predetermined amount, a vacuum state in the conveyance case 4 is maintained. Alternatively, an inert gas may be sealed inside the conveyance case 4 by supplying an inert gas, such as $N_2$, from the gas supply line at a point of reaching a predetermined degree of vacuum.

After the gate valve 30 is closed, the fixation of the conveyance case 4 is released, and the conveyance case 4 is conveyed to a desired position by the conveying mechanism 5 while maintaining the inside in a vacuum state. It is to be noted that, in a case of maintaining the vacuum state inside the conveyance case 4, after closing the gate valve 30 but before releasing the fixation of the conveyance case 4, a procedure of closing a valve of the gas supply line 9 is performed after the space between the gate valve 7 and the gate valve 30 is made to be at an atmospheric pressure by opening the valve of the gas supply line 9.

Accordingly, in conveying the semiconductor wafer W into the conveyance case from outside of the conveying chamber 2, or in conveying the semiconductor wafer W out of the conveying chamber, the semiconductor wafer W makes no contact with the atmosphere in the conveying chamber 2.

Figure 7:
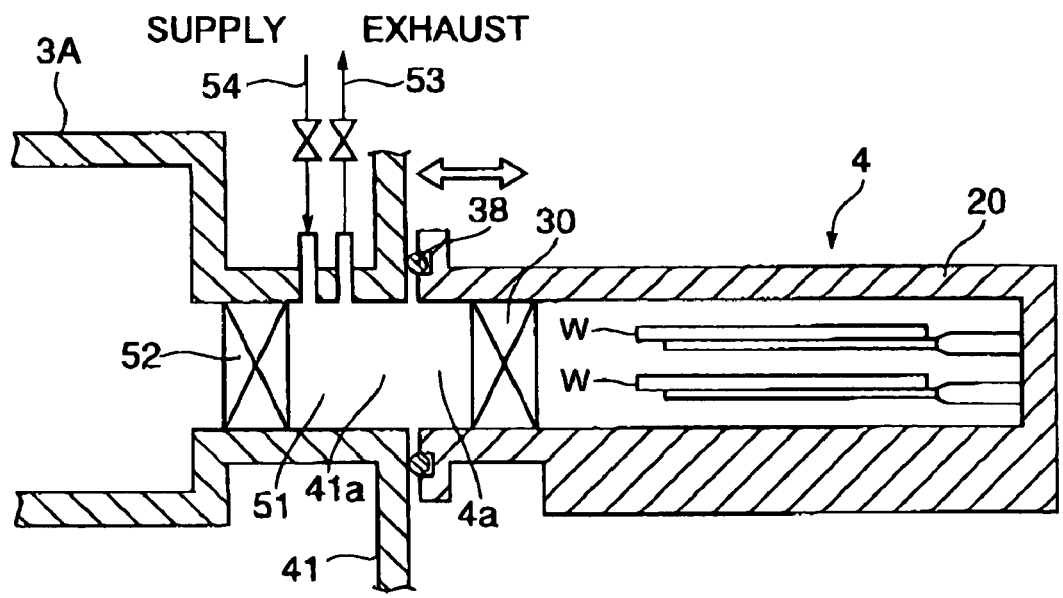
FIG. 7 is a drawing showing a state where a conveyance case is fixed to a processing chamber.

FIG. 7 is a drawing of a configuration showing a state where the conveyance case 4 is fixed to a position corresponding to the conveyance port of the processing chamber 3A (first position). It is to be noted that the configuration shown in FIG. 7 is schematically illustrated.

The above-described plate member 41 of the conveyance case attachment mechanism 40 also serves as a wall of the conveying chamber 2, and the conveyance case 4 is air-tightly attached having the opening 4a in a state aligned to the opening 41a of the plate member 41. The opening 41a continues to a conveyance port 51 of the processing chamber 3A, and has a gate valve 52 provided to the conveyance port 51 of the processing chamber 3A. The gate valve 52 is opened only when conveying the semiconductor wafer in and out of the processing chamber 3A. In the state where the conveyance case 4 is attached, a space is created between the gate valve 30 of the conveyance case 4 and the gate valve 52 of the processing chamber 3A.

In a case where the inside of the conveying chamber 2 is at atmospheric pressure, the space between the gate valve 52 of the processing chamber 3A and the gate valve 30 of the conveyance case 4 is at atmospheric pressure at a point when the conveyance case 4 is fixed. Accordingly, the space is required to be evacuated in order to open the gate valve 52 of an evacuated processing chamber 3A. Accordingly, in this embodiment, an evacuation line 53 and a gas supply line 54 are provided at an outer side of the gate valve 52 of the processing chamber 3A.

After the conveyance case 4 is fixed, evacuation is performed by the evacuation line 53 in a state where the gate valve 52 of the processing chamber 3A and the gate valve 30 of the conveyance case are closed. Then, after the degree of vacuum reaches a predetermined amount, the gate valve 52 and the gate valve 30 are opened to convey in and out the semiconductor wafer W Alternatively, in a case where a predetermined gas is to fill the processing chamber 3A, the predetermined gas may be supplied from the gas supply line 54 before opening the gate valve 52.

Accordingly, with this embodiment, in conveying the semiconductor wafer W from the conveyance case 4 to the processing chamber 3A, or in conveying the semiconductor wafer W out of the processing chamber 3A, the semiconductor wafer W makes no contact with the atmosphere in the conveying chamber 2. Therefore, in this embodiment, the semiconductor wafer W will not be exposed to the atmosphere in the conveying chamber 2 and the conveying chamber 2 is not required to maintain a vacuum state, once the semiconductor wafer w is conveyed from the outside of the conveying chamber 2 to the conveyance case 4. Therefore, the conveying chamber 2 can be enlarged to a given size, and the number of processing chambers connected to the conveying chamber 2 can be increased to a given number.

Furthermore, in this embodiment, since the transfer mechanism and the gate valve 30 serving as a closing mechanism are assembled to the conveyance case 40, the conveying mechanism 5 is merely required to perform a function of carrying the conveyance case 4 to the processing chamber. Since the conveyance case 4 is separable from the conveying mechanism 5, plural conveyance cases 4 can be conveyed with a single conveying mechanism 5. Nevertheless, the conveyance case 4 need not be separated from the conveying mechanism 5 after it is attached to the processing chamber. Alternatively, in a state where the conveyance case 4 is attached to the conveying mechanism 5, the conveying mechanism 5 may stand by until transporting the conveyance case 4 to a next position.

It is to be noted that, although the above-described example is a case where the semiconductor wafer W is conveyed to the processing chamber 3A, the same configuration applies also to the other processing chambers 3B-3F.

Figure 8:
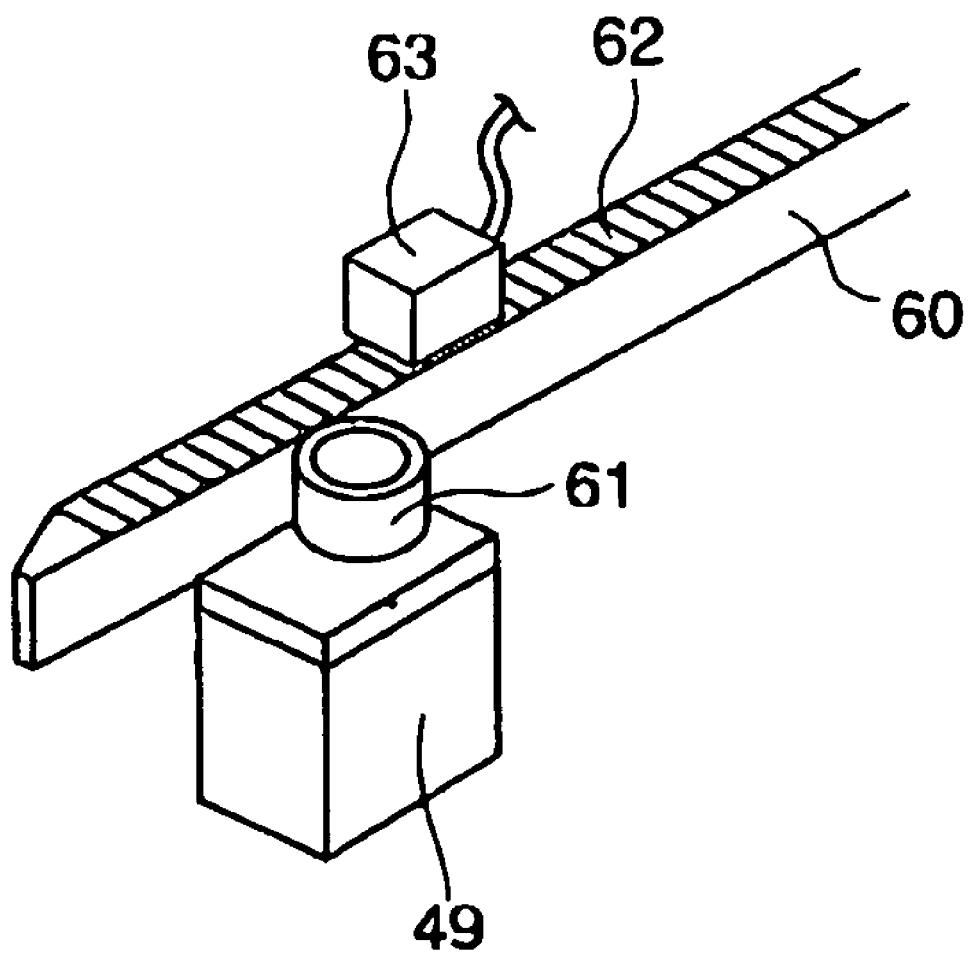
FIG. 8 is a perspective view showing another example of a transfer mechanism.

Here, another example of the transfer mechanism 22 built in the conveyance case 4 is described with reference to FIG. 8. FIG. 8 is a drawing of another example of the transfer mechanism 22 shown in FIG. 3, in which an example of a case where a combination of a traveling member 60 and a roller 61 is employed as an alternative to the combination of the rack and the pinion is illustrated In FIG. 8, the traveling member 60 moves in a longitudinal direction by having the roller 61 pressed against the traveling member 60, and rotating the roller 61 with a motor 49. A movement which is the same as that of the transport mechanism 22 using the rack 24 can be achieved by connecting the rod 23 to the traveling member 60.

It is to be noted that the amount of travel of the traveling member 60, that is, the amount of travel of the pick 21 can be detected by providing a linear scale 62 to the traveling member 60, and detecting the linear scale 62 with a sensor 63.

Next, another example of the transfer mechanism 22 is described with reference to FIG. 9. In increasing the stroke of the transfer mechanism 22 shown in FIG. 3, the length of the rack 24 is required to be increased correspondingly. Thereby, the rack projects considerably to the rear side of the conveyance case 4, and the conveyance case 4 becomes large.

Figure 9:
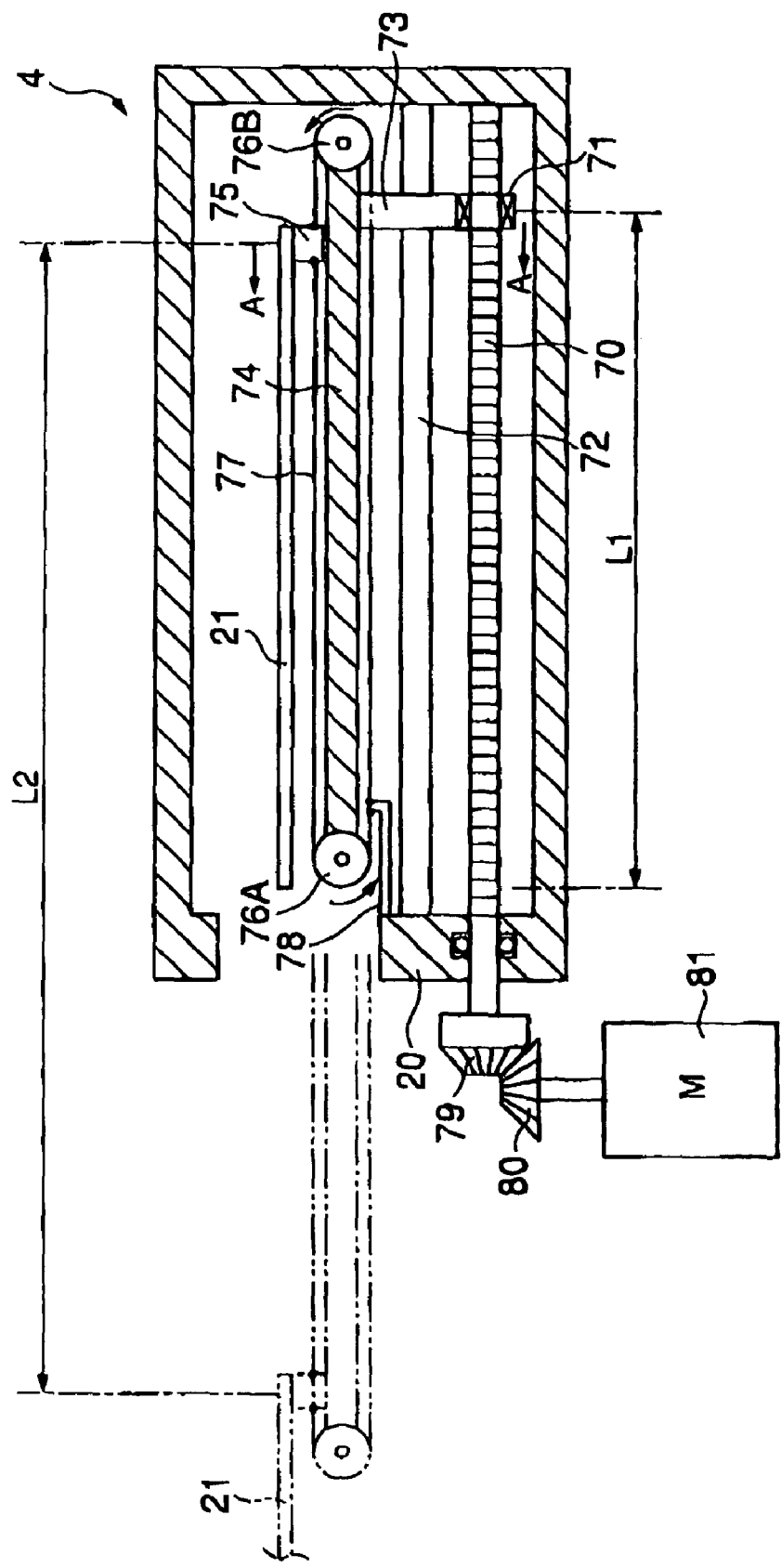
FIG. 9 is a perspective view showing a further other example of a transfer mechanism.

Accordingly, by employing the configuration shown in FIG. 9, the traveling amount can be increased to approximately two times. It is to be noted that the FIG. 9 for showing the transfer mechanism is schematically illustrated.

In the transfer mechanism shown in FIG. 9, a first traveling member 73, which is movable along a first rail 72, is moved by a travel mechanism including a combination of a ball screw 70 and a nut 71. However, this only allows the pick 21 to travel a distance of L1 since the stroke of the travel member 73 is only L1.

Accordingly, the travel member 73 is further attached with a second rail 74, and a second travel member 75 is disposed along the rail 74. The second travel member 75 is connected to a thin belt 77 movably supported by a pair of pulleys 76A, 76B one on each end of the rail 74. The belt 77 is also connected to an engagement member 78 attached to the case main body 20 in the vicinity of the entry port of the conveyance case 4.

Thus structured, when the nut 71 travels in an arrow direction A by the rotation of the ball screw 70, the first travel member 74 also travels in the arrow direction A. Accordingly, the rail 74 attached to the first travel member 73 also travels in the arrow direction A. The travel distance of the second rail 74 is equal to the travel distance of the nut 71. Here, when the rail 74 travels in the arrow direction A, the pulleys 76A, 76B travel likewise, and the belt 77 also travels correspondingly. However, a portion of the belt, which is connected to the engagement member 78 fixed to the case main body 20, is unable to travel. Therefore, the belt 77, being guided by the pulleys 76A, 76B, rotates around the rail 74. Accordingly, the second travel member 75 connected to the belt 77 is pulled by the belt 77 and travels on the rail 74 in the arrow direction A.

Accordingly, the travel distance L2 of the second travel member 75 becomes substantially two times the travel distance L1 of the first travel member 73 since the belt 77 travels (rotates) in correspondence with the travel distance of the rail 74 in arrow direction A. Accordingly, the travel distance of the pick 21 fixed to the second travel member can be increased, and the pick 21 can be inserted deep into the processing chamber even with a small travel mechanism.

It is to be noted that a distal end of the ball screw 70 is extended from the case main body 20 of the conveyance case 4 to the outside, and a bevel gear 79 is attached to the extended distal end. The bevel gear 79 engages a bevel gear 80 when the conveyance case 40 is fixed by the conveyance case attachment mechanism. Accordingly, the ball screw 70 can be rotationally driven from the outside by rotating the bevel gear 80 with a motor 81.

In the above-described embodiment, a drive source of the transfer mechanism 22 is disposed outside of the conveyance case 4 for making the conveyance case 4 as small and light as possible. Accordingly, even if the number of conveying cases 4 is increased, the drive source of the transfer mechanism 22 is not required to be provided to each conveyance case 4, thereby contributing to the reduction of manufacturing cost for the conveyance case 4 and the entire substrate manufacture apparatus.

However, the drive source of the transfer mechanism 22 or the drive source of the gate valve 30 may alternatively be disposed in the conveyance case 4 if there is no restriction for the conveyance case 4, such as size. In this case, a connector for supplying electricity to the drive source disposed in the conveyance case 4 is required. The connector may be provided with a configuration of supplying electricity by, for example, providing a contact member exposed at a side of the entry port of the conveyance case, and contacting a contact member disposed at the plate member 41 when the conveyance case 4 is fixed to the plate member 41. Alternatively, a battery may be provided in the conveyance case as the drive power source.

Furthermore, an electric heater may be assembled with the conveyance case 4 for preheating the semiconductor wafer w in the conveyance case 4. In this case, an electricity supply connector or a battery is required to be provided to the conveyance case 4.

It is to be noted that, in the above-described embodiment, although an example of the conveying mechanism for conveying the conveyance case 4 is described as the conveying mechanism 5 having the arm part 12 attached to the travel part 11 traveling along the rail 10, and the grip part 13 disposed at the distal end of the arm part 12, other conveying mechanism may alternatively be employed. For example, as disclosed in Japanese Laid-Open Patent Application No. 2000-294613, a mechanism, having a movable part lifted from a fixed part with a gas bearing and driving the movable part with a drive part, may alternatively be employed.

The present invention is not limited to the embodiments described above in detail, and can be subjected to various changes and modifications within the scope of the present invention.

The invention claimed is:

1. A substrate processing apparatus comprising:
   at least one processing chamber for applying a process to a substrate housed therein;
   a conveyance case for housing a substrate in a state isolated from an outside atmosphere, having an entry port for conveying in/conveying out a substrate and a transfer mechanism for conveying in/out a substrate through the entry port;
   a conveyance case attachment mechanism connected to the processing chamber and including a transfer mechanism drive source;
   a conveying chamber including a rail part extending in longitudinal direction thereof; and
   a conveying mechanism for carrying the conveyance case to a first position for conveying in/conveying out a substrate to the processing chamber; wherein
   the conveyance case is supported detachably by the conveying mechanism,
   wherein the entry port is configured to hermetically engage the conveyance case attachment mechanism when the conveyance case is carried to the first position,
   wherein the transfer mechanism drive source is configured to drive the transfer mechanism when the entry port hermetically engages the conveyance case attachment mechanism,
   the conveying mechanism includes a vertically retractable arm part configured to hoist the conveyance case and release the conveyance case with a grip part provided at a distal end thereof;
   wherein the conveying mechanism is attached to the rail part and configured to travel inside the conveying chamber along the rail part.

2. The substrate processing apparatus as claimed in claim 1,
   wherein the conveyance case attachment mechanism is configured to fix the conveyance case to the first position, even when the conveyance case is separated from the conveying mechanism.

3. A substrate processing apparatus comprising:
   a plurality of processing chambers for applying a process to a substrate housed therein, having a conveyance port for conveying in/conveying out a substrate;
   a conveyance case for housing a substrate in a state isolated from an outside atmosphere, having an entry port for conveying in/conveying out a substrate and a transfer mechanism for conveying in/out a substrate through the entry port;
   a conveyance case attachment mechanism connected to the processing chamber and including a transfer mechanism drive source;
   a conveying mechanism for carrying the conveyance case to a first position for conveying in/conveying out a substrate to the processing chamber; and
   a conveying chamber delimiting a space in which the conveying mechanism travels, the conveying chamber having a periphery connected to the processing chambers and including a rail part extending in a longitudinal direction thereof; wherein
   the entry port of the conveyance case is connected to the conveyance case attachment mechanism of the processing chamber at the first position,
   the conveyance case is supported detachably by the conveying mechanism,
   wherein the entry port is configured to hermetically engage the conveyance case attachment mechanism when the conveyance case is carried to the first position,
   wherein the transfer mechanism drive source is configured to drive the transfer mechanism when the entry port hermetically engages the conveyance case attachment mechanism, the conveying mechanism includes a vertically retractable arm part configured to hoist the conveyance case and release the conveyance case with a grip part provided at a distal end thereof;

wherein the conveying mechanism is attached to the rail part and configured to travel inside the conveying chamber along the rail part.

4. The substrate processing apparatus as claimed in claim 3, wherein the conveyance case attachment mechanism is configured to fix the conveyance case to the first position, even when the conveyance case is separated from the conveying mechanism.

5. A substrate processing apparatus comprising:

a plurality of processing chambers for applying a process to a substrate housed therein, having a conveyance port for conveying in/conveying out a substrate and a transfer mechanism for conveying in/out a substrate through the entry port;

a conveyance case for housing a substrate in a state isolated from an outside atmosphere, having an entry port for conveying in/conveying out a substrate;

a conveyance case attachment mechanism connected to the processing chamber and including a transfer mechanism drive source;

a conveying mechanism for carrying the conveyance case to a first position for conveying in/conveying out a substrate to the processing chamber; and a conveying chamber delimiting a space in which the conveying mechanism travels, the conveying chamber having a periphery connected to the processing chambers and including a rail part extending in a longitudinal direction thereof; wherein the entry port of the conveyance case is connected to the conveyance case attachment mechanism of the processing chamber at the first position, the conveying chamber has a substrate conveyance port for conveying in/conveying out a substrate, the conveyance case is transported between a second position at which the entry port is connected to the substrate conveyance port and the first position by the conveying mechanism, the transfer mechanism drive source is connected to the transfer mechanism when the conveyance case is fixed to the first or second position, wherein the entry port is configured to hermetically engage the conveyance case attachment mechanism when the conveyance case is carried to the first position, wherein the transfer mechanism drive source is configured to drive the transfer mechanism when the entry port hermetically engages the conveyance case attachment mechanism, the conveying mechanism includes a vertically retractable arm part configured to hoist the conveyance case and release the conveyance case with a grip part provided at a distal end thereof;

wherein the conveying mechanism is attached to the rail part and configured to travel inside the conveying chamber along the rail part.

6. The substrate processing apparatus as claimed in claim 5, wherein the transfer mechanism has a rod for transporting a substrate, and a rack connected to the rod with a coupling member, wherein the transfer mechanism drive source has a motor, and a pinion driven by the motor, wherein the transfer mechanism drive source is connected to the transfer mechanism by engaging the pinion of the transfer mechanism drive source to a distal end part of the rack of the transfer mechanism.

7. The substrate processing apparatus as claimed in claim 5, wherein the transfer mechanism has a gear, a ball screw being attached to the gear, a nut being engaged by the ball screw, a travel member being able to travel along a first rail fixed to the nut, a second rail being attached to the travel member, a pair of pulleys being rotatably supported one at each end of the second rail, a belt being stretched between the pulleys, a second travel member being fixed to the belt, and an engagement member for fixing the belt to a conveyance case main body, wherein the transfer mechanism drive source has a motor and a gear driven by the motor, wherein the transfer mechanism drive source is connected to the transfer mechanism by engaging the gear of the transfer mechanism to the gear of the transfer mechanism drive source.

8. The substrate processing apparatus as claimed in claim 5, wherein the conveyance case attachment mechanism is configured to fix the conveyance case to the first position, even when the conveyance case is separated from the conveying mechanism.

9. A substrate processing apparatus comprising:

a plurality of processing chambers for applying a process to a substrate housed therein, having a conveyance port for conveying in/conveying out a substrate and a transfer mechanism for conveying in/out a substrate through the entry port;

a conveyance case for housing a substrate in a state isolated from an outside atmosphere, having an entry port for conveying in/conveying out a substrate;

a conveyance case attachment mechanism connected to the processing chamber and including a transfer mechanism drive source;

a conveying mechanism for carrying the conveyance case to a first position for conveying in/conveying out a substrate to the processing chamber; and a conveying chamber delimiting a space in which the conveying mechanism travels, the conveying chamber having a periphery connected to the processing chambers and including a rail part extending in a longitudinal direction thereof; wherein the entry port of the conveyance case is connected to the conveyance case attachment mechanism of the processing chamber at the first position, the conveying chamber has a substrate conveyance port for conveying in/conveying out a substrate, the conveyance case is transported between a second position at which the entry port is connected to the substrate conveyance port and the first position by the conveying mechanism, the conveyance case has a closing mechanism for closing the entry port, a closing mechanism drive source for driving the closing mechanism is provided at a fixed position separate from the conveyance case, the closing mechanism drive source is connected to the closing mechanism when the conveyance case is fixed to the first or second position, wherein the entry port is configured to hermetically engage the conveyance case attachment mechanism when the conveyance case is carried to the first position, wherein the transfer mechanism drive source is configured to drive the transfer mechanism when the entry port hermetically engages the conveyance case attachment mechanism, the conveying mechanism includes a vertically retractable arm part configured to hoist the conveyance case and release the conveyance case with a grip part provided at a distal end thereof;

wherein the conveying mechanism is attached to the rail part and configured to travel inside the conveying chamber along the rail part.

10. The substrate processing apparatus as claimed in claim 9, wherein the closing mechanism has a valve for opening and closing the entry port of the conveyance case, a drive member for driving the valve, and a flange member being connected to the drive member, the closing mechanism drive source has an actuator, and an engagement member being attached to the actuator, and the closing mechanism drive source is connected to a transfer mechanism by engaging the flange member of the closing mechanism with the engagement member of the closing mechanism drive source.

11. The substrate processing apparatus as claimed in claim 9, wherein the conveyance case attachment mechanism is configured to fix the conveyance case to the first position, even when the conveyance case is separated from the conveying mechanism.

* * * * *